United States Patent
Esterberg et al.

(10) Patent No.: US 6,873,281 B1
(45) Date of Patent: Mar. 29, 2005

(54) INTERLEAVED DIGITAL CORRECTION FOR MASH DELTA-SIGMA ADC

(75) Inventors: Aanand Esterberg, Seattle, WA (US); Scott Cooper, Seattle, WA (US)

(73) Assignee: Impinj, Inc., Seattle, WA (US)

( * ) Notice: Subject to any disclaimer, the term of this patent is extended or adjusted under 35 U.S.C. 154(b) by 0 days.

(21) Appl. No.: 10/652,537

(22) Filed: Aug. 28, 2003

(51) Int. Cl.[7] .................................................. H03M 1/34
(52) U.S. Cl. ........................ 341/163; 341/143; 341/61; 341/76
(58) Field of Search ................................ 341/163, 143, 341/61, 76, 123

(56) References Cited

U.S. PATENT DOCUMENTS

| | | | | |
|---|---|---|---|---|
| 5,870,048 A | * | 2/1999 | Kuo et al. | 341/143 |
| 5,936,562 A | | 8/1999 | Brooks et al. | 341/143 |
| 5,959,562 A | | 9/1999 | Wiesbauer | 341/143 |
| 5,982,313 A | * | 11/1999 | Brooks et al. | 341/143 |
| 5,982,315 A | | 11/1999 | Bazarjani et al. | 341/143 |
| 6,137,431 A | * | 10/2000 | Lee et al. | 341/163 |
| 6,151,613 A | | 11/2000 | Khoini-Poorfard | 708/313 |
| 6,373,417 B1 | * | 4/2002 | Melanson | 341/143 |
| 6,424,279 B1 | * | 7/2002 | Kim et al. | 341/143 |
| 6,496,128 B2 | * | 12/2002 | Wiesbauer et al. | 341/143 |
| 6,522,275 B2 | * | 2/2003 | May | 341/61 |
| 6,570,518 B2 | * | 5/2003 | Riley et al. | 341/143 |
| 6,587,061 B2 | * | 7/2003 | Petrofsky | 341/143 |

OTHER PUBLICATIONS

"Chapter 3, Cascaded Delta–Sigma ADCs", pp. 45–71. 2001.

Kiss et al., "Adaptive Digital Correction of Analog Errors in MASH ADCs—Part II. Correction Using Test-Signal Injection", Jul. 2000, IEEE Transactions on Circuits and Systems–II: Analog and Digital Signal Processing, vol. 47, No. 7, pp. 629–638.

Silva et al., "Digital Techniques for Improved ΔΣData Coversion", Department of Electrical and Computer Engineering, Oregon State University, Corvallis, OR, 8 pp. 2001.

* cited by examiner

*Primary Examiner*—Michael Tokar
*Assistant Examiner*—Lam T. Mai
(74) *Attorney, Agent, or Firm*—Thelen Reid & Priest LLP; William E. Winters

(57) ABSTRACT

Methods of and apparatuses for optimizing quantization noise cancellation in multi-phase sampled MASH ADCs are disclosed. A test signal is combined with quantization noise produced by a delta-sigma modulator. Two parallel adaptive filters (i.e. even and odd filters) are configured to receive respective even and odd samples of a digital output signal of a MASH ADC analog modulator. Adaptive coefficients for the even adaptive filter are derived from correlation results between the even samples of the test signal and associated even samples of the final digital output signal. Similarly, adaptive coefficients for the odd adaptive filter are derived from correlation results between the odd samples of the test signal and associated odd samples of the final digital output signal. Using the adaptive coefficients, the even and odd adaptive filters are able to independently compensate for analog variations in the two paths. Fixed, slowly varying, and clock rate variations may all be tracked out using the methods and apparatus of the present invention.

19 Claims, 7 Drawing Sheets

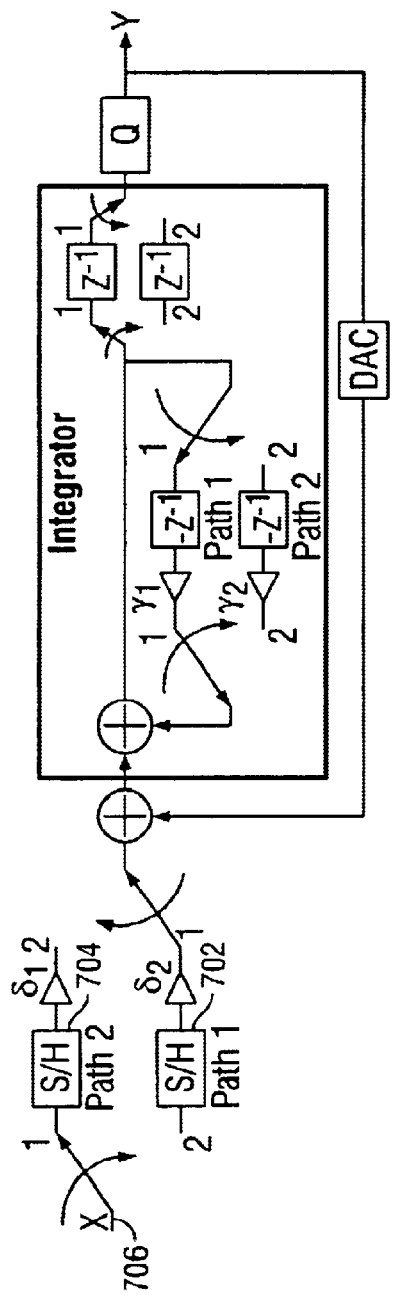
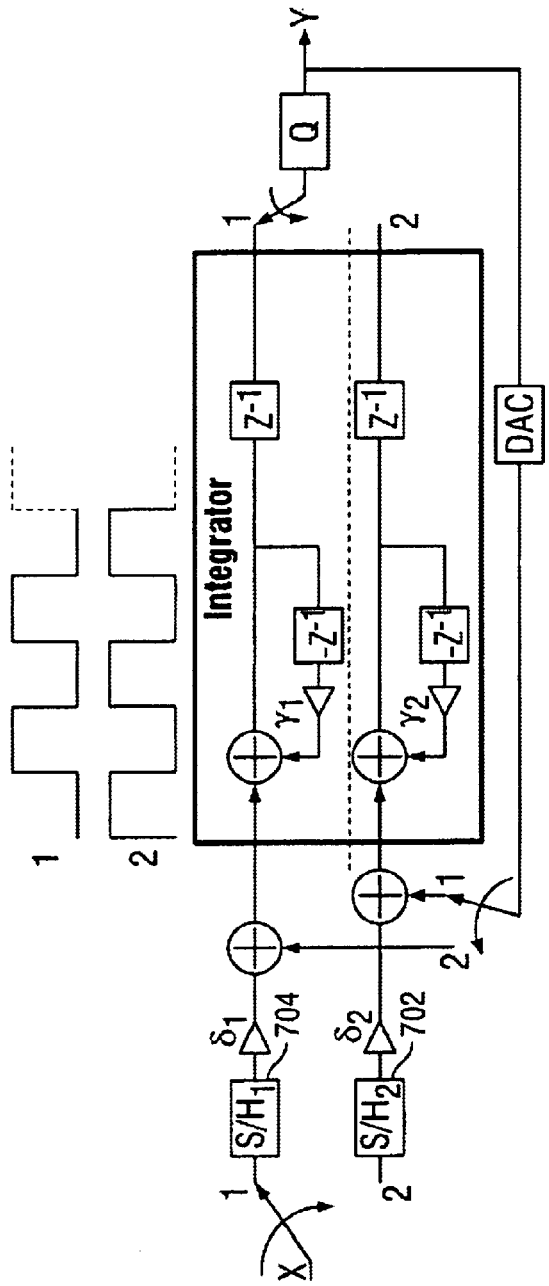
FIG. 7A
FIG. 7B

US 6,873,281 B1

INTERLEAVED DIGITAL CORRECTION FOR MASH DELTA-SIGMA ADC

FIELD OF THE INVENTION

The present invention relates generally to signal processing in electronic systems. More particularly, the present invention relates to digital correction for MASH delta-sigma ADCs.

BACKGROUND OF THE INVENTION

Analog-to-digital converters (ADCs) are commonly found in communications systems and audio, video and multimedia electronics systems. One type of ADC, shown in FIG. 1, is the delta-sigma ADC 10. The delta-sigma ADC 10 consists of a sample and hold (S/H) circuit 11, a subtractor 12, a discrete-time integrator 14, a quantizer 16, a one-bit digital-to-analog converter (DAC) 18 in a feedback loop 20, and a digital decimation filter 22. The delta-sigma ADC 10 operates as follows. An analog input signal is received by the S/H circuit 11, which provides a sampled analog input signal to the subtractor 12. The subtractor 12 subtracts an estimate signal provided by the DAC 18 from the sampled analog input signal, generating an error signal that is input to the integrator 14. As explained in more detail below, the integrator 14 behaves as a filter. The quantizer 16 samples the analog signal received from the integrator 14 and provides a stream of digital output samples. The one-bit DAC 18 converts the digital samples from the quantizer 16 into an analog estimate signal, which is fed to the subtractor 12, via the feedback loop 20. The digital decimation filter 22 reduces the data rate down from the oversampling sampling rate so that the data is more manageable, and filters the digital output samples to remove quantization noise.

The delta-sigma converter 10 employs techniques known as "oversampling" and "noise shaping" to increase the signal-to-noise ratio (SNR) in the signal band of interest. Oversampling spreads the quantization noise power, produced by the quantizer 16 during conversion, over a bandwidth equal to the sampling frequency, which is at a frequency much greater than the signal bandwidth. Noise shaping is performed by the integrator 14, which behaves, in conjunction with the loop, as an all-pass filter on the signal, and as a highpass filter on the noise created by the quantizer during conversion. The effect of noise shaping is a redistribution of the quantization noise such that most of the noise energy is shifted to a frequency band that is outside the signal bandwidth.

One well-known improvement of the delta-sigma ADC is the Multi-StAge NoiSe SHaping (MASH) delta-sigma ADC. According to this improvement, quantization noise is reduced by increasing the order of the noise-shaping transfer function through the use of multiple modulator stages connected together in a semi-cascade type of arrangement. FIG. 2 shows a block diagram of a typical MASH delta-sigma ADC 20. MASH delta-sigma ADC 20 is composed of analog 22 and digital 24 sections. The analog section 22 includes two or more modulators 23-1, 23-2, . . . ,23-N. Modulator 23-1 contains a sample and hold (S/H) circuit 26, one or more series integrators 28, a quantizer 30, and a DAC 32 disposed in a feedback loop 34. The order of a modulator is determined by the number of series integrators in the noise shaping path. A zero order modulator is composed of only a single quantizer. A MASH delta-sigma ADC can theoretically contain an arbitrary number of modulators or stages, although two or three is common. The MASH architecture is desirable because it offers superior high order noise shaping with guaranteed stability. The benefit is a less complex hardware implementation because a lower oversampling ratio (OSR) is permissible, and consequently a lower sampling rate is required to achieve the same SNR as compared to the basic delta-sigma ADC shown in FIG. 1.

The concept of noise cancellation in a MASH architecture is illustrated in FIG. 3, which shows a block diagram of a two-stage MASH ADC 30 where the second modulator 34 is zero order. In the frequency domain, the signal input is represented by X, the quantization noise from a first modulator 32 is $Q_1$ and from quantizer 34 is $Q_2$. $NTF_1$ represents the analog Noise Transfer Function (NTF) filter from the modulator 32, $NTF_{1,est}$ represents the NTF of digital filter 36, and $Nd_1$ represents a noise component due to other sources in the first modulator 32. The digital filter 36 is designed to match the analog NTF so that the effect of the first modulator 32 quantization error ($Q_1$) is canceled at the output. If the analog and digital filters do not match (i.e., $NTF_1 - NTF_{1,est}$ is not zero over all frequencies) the SNR performance is degraded. Hence, one disadvantage of the MASH architecture is that it is sensitive to matching accuracy of analog and digital processing circuits.

FIGS. 4A and 4B show examples of switched-capacitor implementations of a two-phased S/H circuit 40 and a band-pass integrator 42, respectively, which may be used in a MASH delta-sigma ADC like the one shown in FIG. 2. The two-phased S/H circuit 40 allows more time to complete the capture of signals than a single-phased sampling element. While one capacitor is sampling the input the other is delivering its charge to the selected integrator feedback capacitor. This sequence eases the speed requirements on the Operational Transconductance Amplifier (OTA). FIG. 4C shows a timing diagram for the two-phased S/H circuit 40 in FIG. 4A: switches are closed when the corresponding waveform is high. The integrator in FIG. 4B provides a band-pass NTF when used in the modulator shown in FIG. 3. Whereas a single-ended configuration is shown, differential configurations can also be used. FIG. 4D shows a timing diagram for the band-pass integrator 42 in FIG. 4B.

Non-ideal switches, capacitors, and OTAs, etc., in the S/H circuit 40, the integrator 42, and other analog circuitry of the modulator, increase noise and introduce in-band spurious signals. The noise and spurious signals operate to reduce the SNR performance of the ADC. Various attempts to overcome this matching problem in MASH architectures have been proposed. A first approach is to simply provide for more accurate matching of analog components. However, this approach is unattractive because accurate matching of circuits implies larger devices, slower speed, higher power, and extensive design effort to achieve the required analog tolerances.

A second approach, described in U.S. Pat. No. 6,075,820, utilizes the injection of a signal at the input to the delta-sigma ADC. A drawback of this technique, however, is that the ADC input must be disconnected from its nominal input to perform this calibration.

A third approach is to provide digital compensation using a test signal injected at the quantizer input and a single adaptive filter. This technique is described by P. Kiss, et al., in "Adaptive Digital Correction of Analog Errors in MASH ADC's—Part II: Correction Using Test-Signal Injection," IEEE Transactions on Circuits and Systems II: Analog and Digital Signal Processing, vol. 47, no. 7, July 2000, pp. 629–638. A block diagram of such a MASH ADC 50 is shown in FIG. 5. The MASH ADC 50 includes a first modulator 51 and an adaptive digital filter 52, which is augmented by a fixed filter 53. A test signal 54 is summed with the quantization noise from the first modulator 51 and also applied to a coefficient generator 55 where it is correlated with the ADC final output Y. The coefficient generator 55 correlates the test signal 54 with the ADC final output Y, deriving coefficients, which it provides to an adaptive compensation filter 56 (i.e. a finite impulse response (FIR) filter). The output $Y_3$ from a second modulator 57 is filtered by the FIR filter 56 and the fixed filter 53. The outputs of adaptive filter 52 and fixed filter 53 are summed by a first summer 58, to form a composite digital NTF filter. The digital NTF filter is modified in this way to track uncertainty in the analog NTF. Finally, the composite digital NTF filter output is summed with the delayed output of the first modulator 51 by a second summer 59.

So long as the adaptation update rate is fast enough, fixed or slowly time varying changes in the analog NTF can be tracked out by the technique employed by MASH ADC 50 in FIG. 5. However, analog variations that occur at rates commensurate with the clock frequency cannot be tracked by this technique. This can be explained as follows. The digital NTF filter is based on minimizing the residual test signal over digital samples at the ADC output Y. In order to correct analog variations, correlations using multiple digital samples must be made to derive the proper coefficients of the digital NTF filter, thereby delaying the correction and limiting the speed at which the digital NTF filter tracks the analog NTF to a fraction of the sample rate. Consequently, a drawback of the approach shown in FIG. 5 is that it is limited in its ability to compensate for analog NTF characteristics that are time variant at the clock frequency.

SUMMARY OF THE INVENTION

In accordance with embodiments of the present invention, methods of and apparatuses for optimizing quantization noise cancellation in multi-phase sampled MASH ADCs are disclosed. A test signal is combined with quantization noise produced by a delta-sigma modulator. Two parallel adaptive filters (i.e. even and odd filters) are configured to receive respective even and odd samples of both the test signal and a digital output signal of the MASH ADC. Adaptive coefficients for the even adaptive filter are derived from correlation results between the even samples of the test signal and associated even samples of the digital output signal. Similarly, adaptive coefficients for the odd adaptive filter are derived from correlation results between the odd samples of the test signal and associated odd samples of the digital output signal. Using the adaptive coefficients, the even and odd adaptive filters are able to independently compensate for analog variations in the two paths. The disclosed methods and apparatuses eliminate fixed, slowly varying, and time varying analog errors that occur at the clock frequency, thereby enhancing the SNR performance of the associated MASH ADC.

Further aspects of the invention are described and claimed below, and a further understanding of the nature and advantages of the inventions may be realized by reference to the remaining portions of the specification and the attached drawings.

BRIEF DESCRIPTION OF THE DRAWINGS

FIG. 7A is an interleaved z-domain diagram of a delta-sigma modulator, illustrating how compensation for analog variations is accomplished in an ADC having multi-phased S/H circuitry and integrators, such as might be found in the MASH delta-sigma ADC shown in FIG. 6; and FIG. 7B is an equivalent representation of the interleaved z-domain diagram of FIG. 7A.

DETAILED DESCRIPTION

Figure 1:
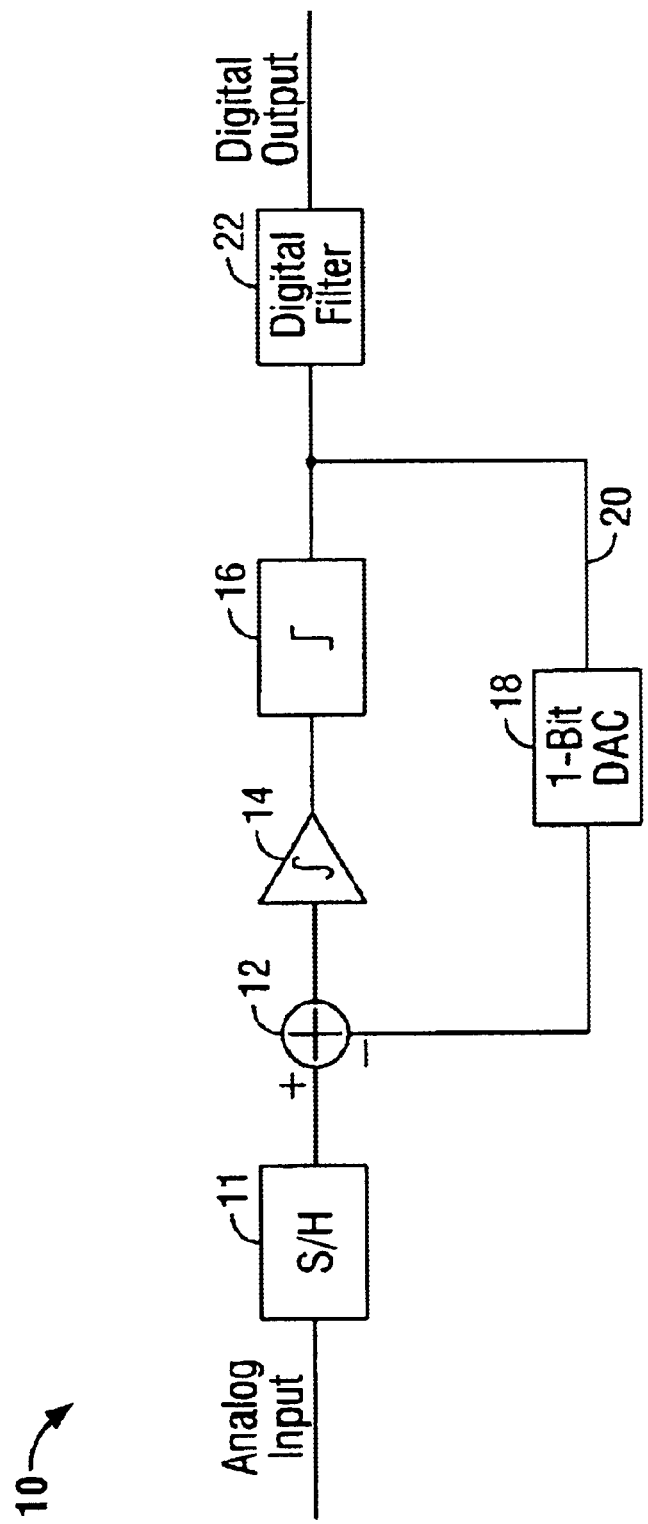
FIG. 1 is a block diagram of a typical delta-sigma ADC.
Figure 2:
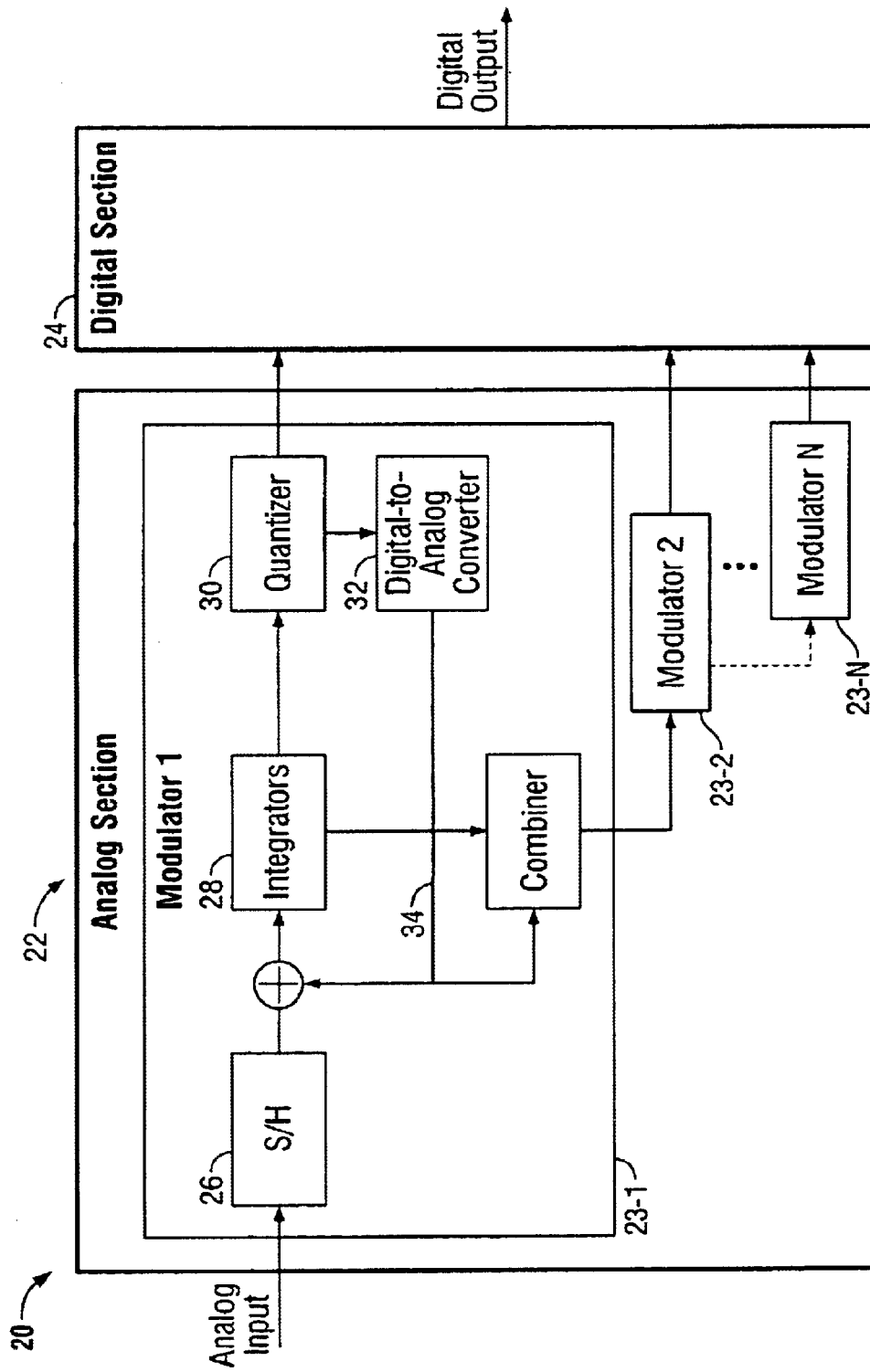
FIG. 2 is a block diagram of a typical MASH delta-sigma ADC.
Figure 3:
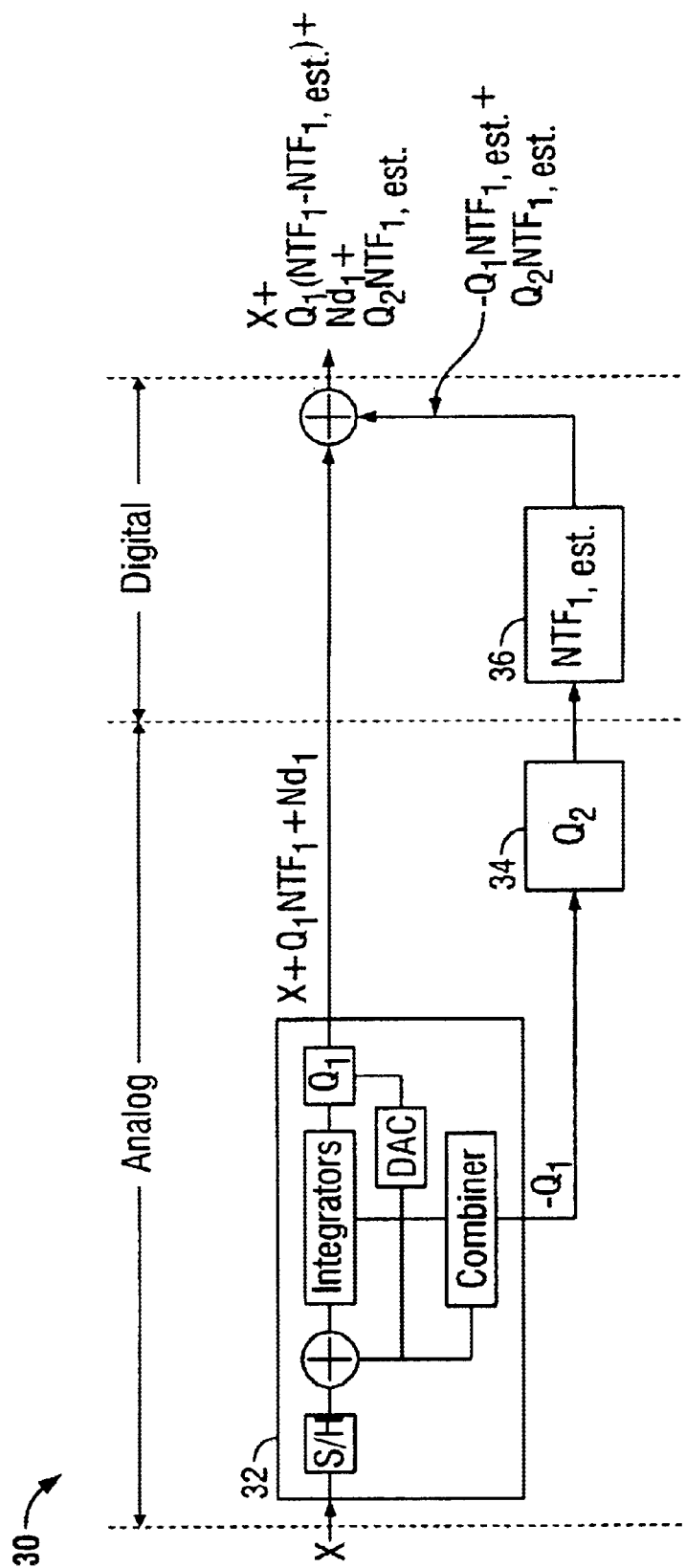
FIG. 3 is a block diagram of a two-stage MASH ADC, where the second modulator is of zero order.
Figure 4A:
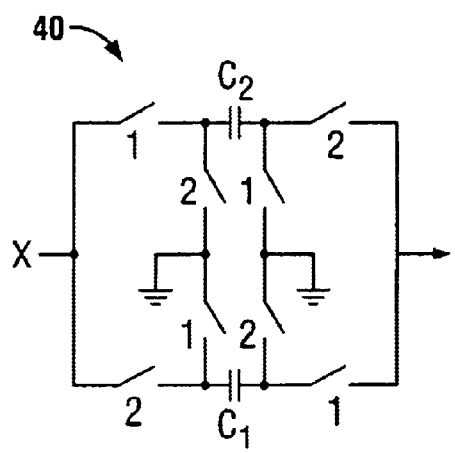
FIG. 4A is a simplified schematic diagram of a two-phased switched capacitor S/H circuit.
Figure 4B:
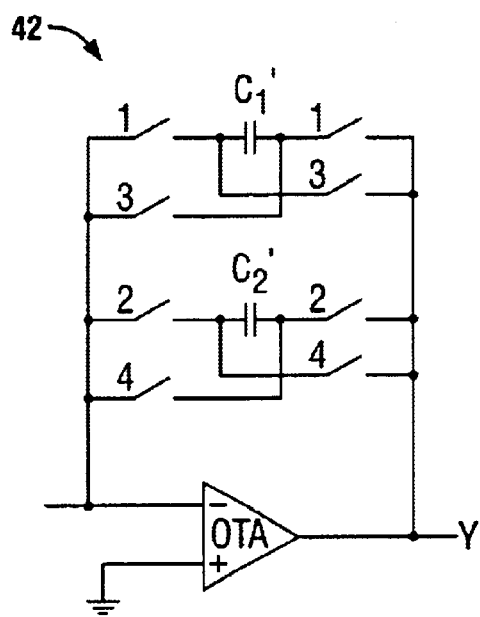
FIG. 4B is a simplified schematic diagram of a two-phased integrator that can work in conjunction with the two-phased switched capacitor S/H circuit in FIG. 4A.
Figure 4C:
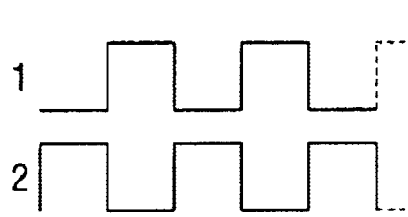
FIG. 4C is a timing diagram for the two-phased switched capacitor S/H circuit of FIG. 4A.
Figure 4D:
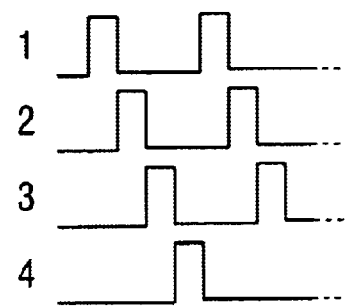
FIG. 4D is a timing diagram for the band-pass integrator of FIG. 4B.
Figure 5:
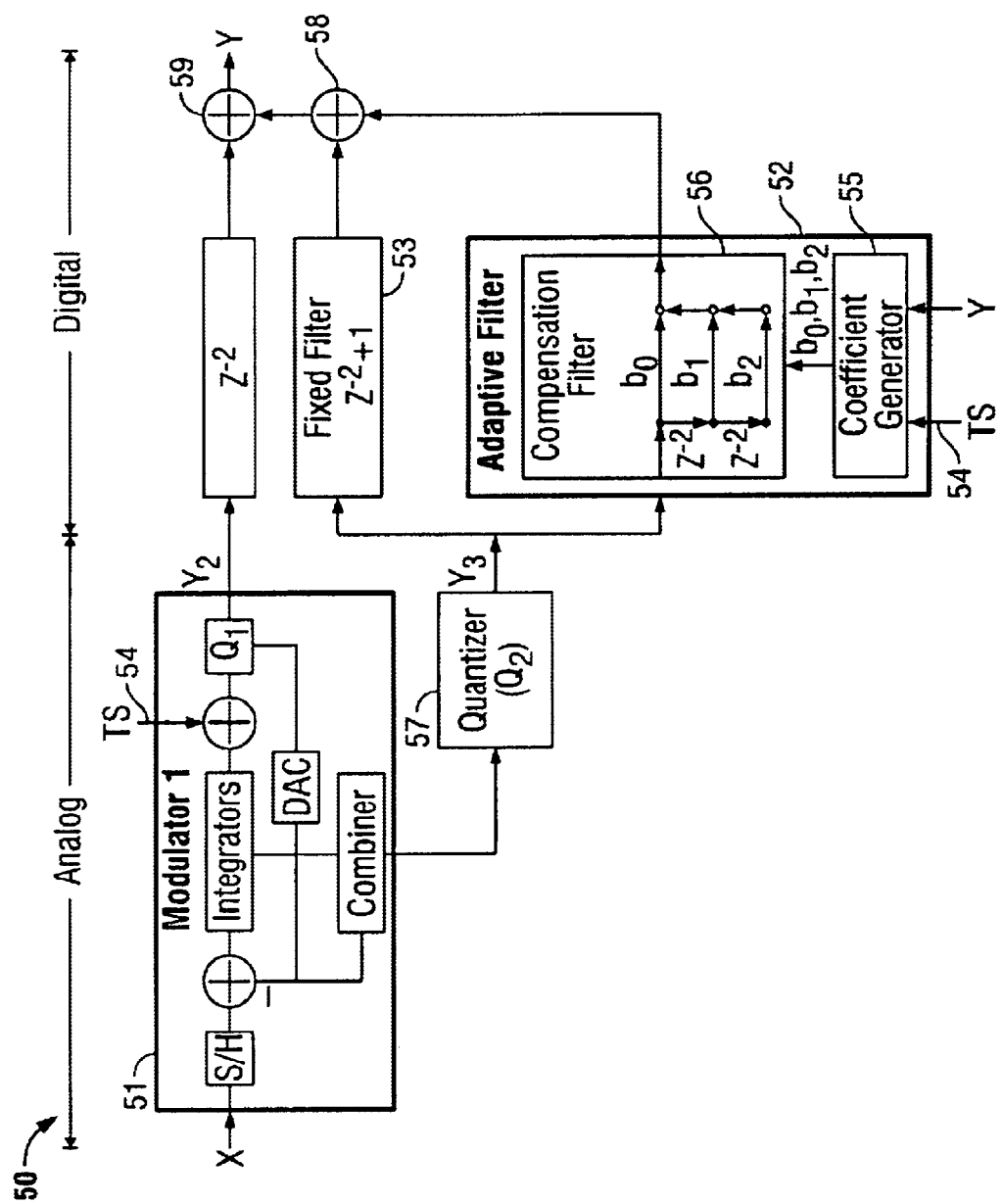
FIG. 5 is a block diagram of a MASH ADC that provides quantization noise cancellation.
Figure 6:
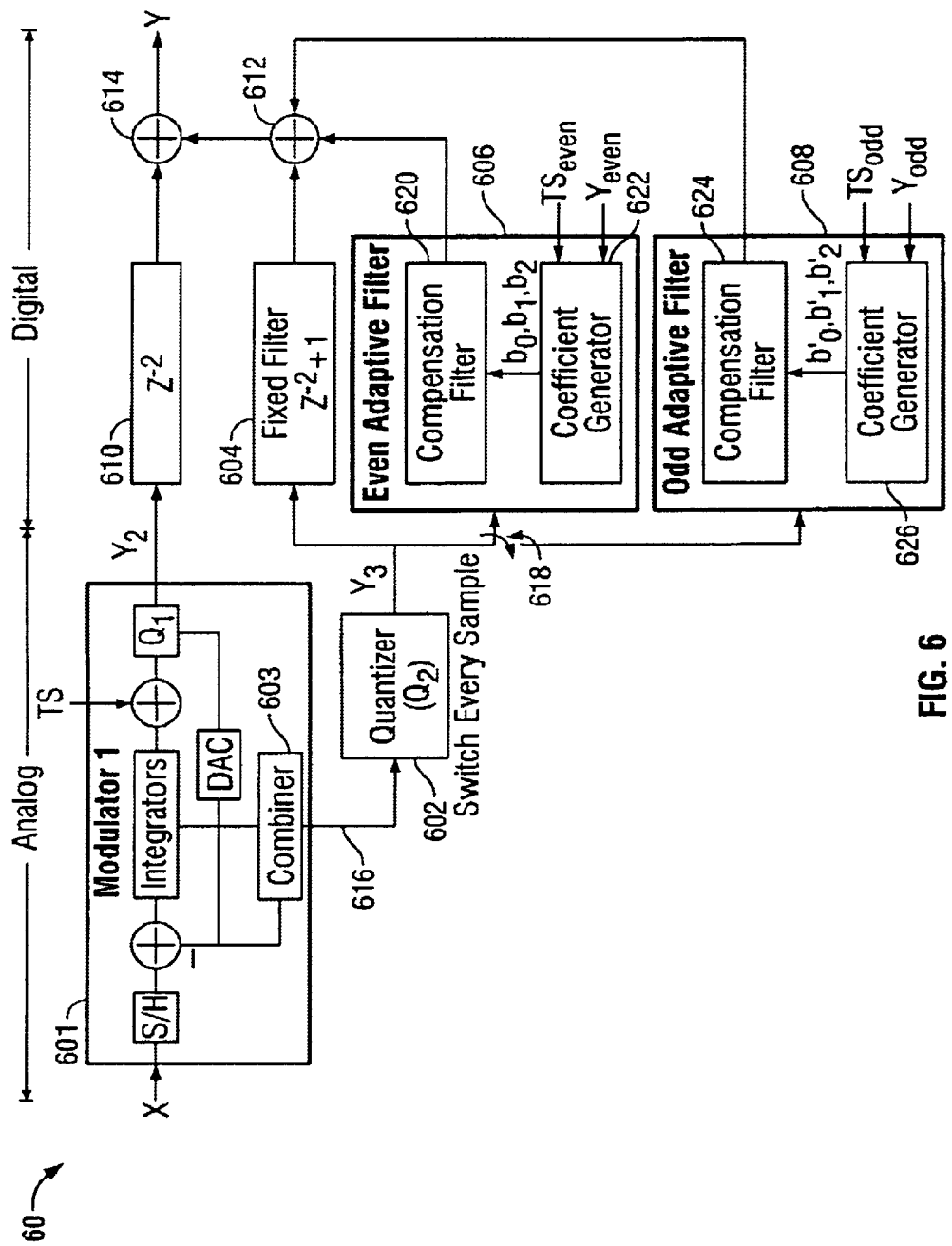
FIG. 6 is a block diagram of a MASH delta-sigma ADC employing multi-phased sample and hold circuits and integrators and including interleaved digital correction, according to an embodiment of the present invention.

Referring to FIG. 6, there is shown a MASH delta-sigma ADC 60 employing multi-phased sample and hold circuits and integrators, and including interleaved digital correction, according to an embodiment of the present invention. MASH delta-sigma ADC 60 provides compensation for analog variations of circuit components switched into and out of the ADC on alternating phases of the sampling clock, e.g., by action of multi-phase S/H circuits and multi-phase integrators. MASH delta-sigma ADC 60 comprises a first delta-sigma modulator 601, a second zero order delta-sigma modulator comprising a quantizer 602, a fixed filter 604, a first adaptive filter 606, a second adaptive filter 608, a delay 610, and first and second summers 612 and 614. MASH delta-sigma ADC 60 receives an analog input signal X at an input of first delta-sigma modulator 601. A test signal TS is summed with the quantization noise in the first delta-sigma modulator 601. The test signal TS is uncorrelated with both the analog input signal and the quantization noise. It follows the same processing path as the as the quantization noise. As explained below, even and odd samples of the test signal TS are detected and adaptively cancelled in the final output Y of the ADC 60. The first delta-sigma modulator 601 produces a digital data stream $Y_2$, which represents the input signal, combined with a first shaped noise signal. The noise is shaped by an analog NTF, which can vary at the sample rate. Quantizer 602 receives a noise signal (on line 616) comprising quantization noise and a test signal from the first delta-sigma modulator 601 and produces a second noise digital data stream $Y_3$. The noise signal on line 616 is generated by either a combination of the output of the integrator and the DAC (e.g. by a combiner 603) or just the output of the integrator. The second noise digital data stream $Y_3$ is switched every sample alternately between the first (i.e. even) adaptive filter 606 and the second (i.e. odd) adaptive filter 608 by a switch 618. The even adaptive filter 606 includes a compensation filter 620 and a coefficient generator 622. Adaptive coefficients of coefficient generator 622 are derived from the correlation results between even samples of the test signal $TS_{even}$ and even samples of the final ADC output $Y_{even}$. Odd adaptive filter 608 includes a compensation filter 624 and a coefficient generator 626. Adaptive coefficients of coefficient generator 626 are derived from the correlation results between odd samples of the test signal $TS_{odd}$ and odd samples of the final ADC output $Y_{odd}$. The correlation results can be used to adjust the adaptive filters with an algorithm such as, for example, LMS. The even adaptive filter 606 compensates for analog non-idealities existing on even samples and the odd adaptive filter compensates for odd sample non-idealities, so that even and odd samples of the test signal TS and ADC output independently compensate for analog variations in the two paths. In other words, compensation is accomplished by separating the correlation function into even and odd correlators operating with even and odd test sequence samples. Each adaptive filter, in conjunction with the fixed filter, generates the digital NTF. When the digital NTF matches the analog NTF, the test signal and quantization noise from the first modulator 601 is eliminated from the output of the ADC. Fixed, slowly varying, and clock rate variations can, therefore, be tracked out according to these embodiments of the present invention.

FIG. 7A shows an interleaved z-domain diagram that illustrates how compensation for analog variations is accomplished in an ADC having a two-phased S/H circuit and a two-phased integrator, according to an embodiment of the present invention. A two-phased S/H circuit is shown, comprised of a first S/H circuit 702 and a second S/H circuit 704, and a two-phased integrator provide time varying interconnect between first and second paths Path 1 and Path 2. A switch position of an input switch 706 is taken on the rising edge of the associated clock. The parameters $\delta_1$ and $\delta_2$ in FIG. 7 represent gain errors in the paths through the two-phased sampled S/H. Gain errors in the S/H paths represent one example of a factor that affects the NTF. A primary source of gain error occurs when the ratio between the sampling and integrator capacitors deviates from ideal. According to embodiments of the present invention, any gain error that causes the NTF to deviate from ideal is addressed. If the gain error in a S/H path varies at a rate commensurate with the digital adaptation rate, then such a time varying error can be eliminated. Mismatch in the gain errors between the S/H paths results in changes in the NTF that occur on alternate cycles. The result is a time-varying non-ideal NTF.

Elements in each integrator path can also induce errors that influence the NTF. In FIG. 7A the parameters $\gamma_1$ and $\gamma_2$ represent OTA gain errors, which are one type of error that may arise in the integrator. A gain error at this point in the modulator will cause the NTF pole to deviate from its nominal position. When the input switch 706 is in position 1, the capacitor in S/H Path 2 is charged by the input signal X. During this same period, the capacitor in S/H Path 1 is discharged into the capacitor in Path 1 of the integrator. When the input switch 706 is in position 2, the capacitor in S/H Path 1 is charged by the input signal X, and the capacitor in S/H Path 2 is discharged into the capacitor in Path 2 of the integrator.

An analysis of FIG. 7A reveals that samples from S/H Path 1 are always routed to integrator Path 1 and samples from S/H Path 2 are always routed to integrator Path 2. Accordingly, an equivalent representation of FIG. 7A is shown in FIG. 7B, where Paths 1 and 2 independently operate on odd and even samples.

One advantage to using the techniques described in the embodiments above is that they reduce the complexity of the design. Less effort is required for design and layout of the analog circuitry. Benefits are faster design cycle and less performance risk. Tolerance to analog parameters and variations in parameters enables the use of smaller device geometries in an integrated circuit (IC) implementation. Benefits are faster devices and cost savings associated with a smaller die area. Another advantage is that the benefits of multi-phased S/H circuits and integrators are realized without the performance impact associated with approaches described by the prior art. A multi-phased S/H circuit provides the benefit of achieving a target sampling rate while allowing much of the circuitry to operate at half the rate of a single-phase S/H circuit. A multi-phased integrator is required to achieve a band-pass NTF response. Band-pass ADCs are a common class of ADC that provides systems benefits by accepting a signal input at an Intermediate Frequency (IF). Overall, the embodiment of the present invention provide for band-pass operation with better SNR at a target sampling rate or higher sampling rate and bandwidth at a target SNR. Prior approaches are limited in that using a single test signal and adaptive filter does not have the necessary adaptation bandwidth to track out analog variations that change at rates commensurate with the sampling frequency. The embodiments of the present invention also allow distributed adaptation in multiple parallel digital adaptive filters, each filter running at a fraction of the clock frequency.

Whereas the above is a complete description of the preferred embodiments of the invention, various alternatives, modifications, and equivalents may be used without departing from the inventive concepts herein. For example, whereas the exemplary embodiment of the MASH delta-sigma ADC 60 in FIG. 6 is shown to have two modulator stages and two adaptive filters, those skilled in the art will understand that the inventions described herein are applicable to any number of stages and adaptive filters. Further, those skilled in the art will readily understand that the embodiments of the present invention apply broadly to any MASH delta-sigma ADC that uses multi-phase S/H circuits and integrators. Therefore, the above description should not be taken as limiting the scope of the invention as it is defined by the appended claims.

What is claimed is:

1. A method of canceling quantization noise in an ADC, comprising:

sampling an analog signal provided to a first delta-sigma modulator to produce a sampled analog input signal;

generating a sampled analog error signal from the difference of said analog input signal and a DAC output;

integrating said sampled analog error signal to produce a first integrated error signal;

summing a test signal with the first integrated error signal and quantization noise produced by said first delta-sigma modulator;

generating, as an output, a first noise signal comprising the quantization noise test signal using said integrated error signal;

estimating an even sample NTF corresponding to even samples of the sampled analog input signal;

estimating an odd sample NTF corresponding to odd samples of the sampled analog input signal;

forming a composite estimated NTF that includes said even and odd estimated NTFs; and subtracting said composite estimated NTF filtered noise from an analog NTF filtered noise from said first delta-sigma modulator.

2. The method of claim 1 wherein generating, as an output, a first noise signal further comprises using said DAC output.

3. The method of claim 1 wherein estimating the even sample NTF includes deriving even sample adaptive coefficients by correlating even samples of a digital output signal of the ADC with associated even samples of said test signal.

4. The method of claim 3 wherein estimating the odd sample NTF includes deriving odd sample adaptive coefficients by correlating odd samples of the digital output signal with associated odd samples of said test signal.

5. The method of claim 4, further comprising introducing said first noise signal from said first delta-sigma modulator to a second modulator to produce a second noise signal.

6. The method of claim 5 wherein estimating the even sample NTF further includes adaptively filtering said second noise signal using said even sample adaptive coefficients, and estimating the odd sample NTF further includes adaptively filtering said second noise signal using said odd sample coefficients.

7. A method of compensating for analog variations in a MASH delta-sigma ADC, comprising:
   summing a test signal with quantization noise produced by a first stage of the MASH delta-sigma ADC;
   alternately coupling a noise signal from a second stage of the MASH delta-sigma ADC between a first adaptive filter and a second adaptive filter;
   deriving adaptive coefficients for said first adaptive filter by correlating every other sample of the test signal with a corresponding every other sample of an output signal of the MASH delta-sigma ADC;
   deriving adaptive coefficients for said second adaptive filter by correlating samples positioned between said every other sample of the test signal with corresponding samples positioned between said every other sample of the output signal of the MASH delta-sigma ADC;
   filtering said noise signal using said first adaptive filter, when said noise signal is coupled to said first adaptive filter, to produce a first digital NTF component;
   filtering said noise signal using said second adaptive filter, when said noise signal is coupled to said second adaptive filter, to produce a second digital NTF component;
   summing said first and second estimated NTF components to form a composite digital NTF; and
   subtracting said composite digital NTF filtered noise from an analog NTF filtered noise produced by said first stage of said MASH delta-sigma ADC.

8. An analog-to-digital converter (ADC), comprising:
   a first modulator configured to receive an analog input signal, sample the input signal at a sampling rate, and generate a first noise digital data stream, said first modulator including a summer for accepting a test signal;
   a second modulator configured to receive an output of an integrator within said first modulator and provide a second noise digital data stream;
   a first adaptive filter;
   a second adaptive filter; and
   a switch adapted to alternately couple the second noise digital data stream to said first and second adaptive filters at a rate proportional to or equal to said sampling rate.

9. The ADC of claim 8 wherein said first adaptive filter comprises:
   a first adaptive filter coefficient generator configured to receive every other sample of a digital output signal of the ADC and associated every other sample of said test signal; and
   a first adaptive compensation filter configured to receive first adaptive coefficients from said first adaptive filter coefficient generator, said first adaptive coefficients derived from a correlation between said every other sample of the digital output signal and said associated every other sample of said test signal.

10. The ADC of claim 9 wherein said second adaptive filter comprises:
    a second adaptive filter coefficient generator configured to receive samples of said digital output signal that are between said every other sample of the digital output signal and samples of said test signal that are between every other sample of the test signal; and
    a second adaptive compensation filter configured to receive second adaptive coefficients from said second adaptive filter coefficient generator, said second adaptive coefficients derived from a correlation between said samples of the digital output signal that are between said every other sample of the digital output signal and samples of said test signal that are between every other sample of said test signal.

11. The ADC of claim 8 wherein said first adaptive filter has inputs for receiving even samples of said test signal and even samples of a digital output signal of the ADC, and said second adaptive filter has inputs for receiving odd samples of said test signal and odd samples of said digital output signal.

12. The ADC of claim 11 wherein said first adaptive filter compensates for analog non-idealities that may occur on even samples of said analog input signal, and said second adaptive filter compensates for analog non-idealities that may occur on odd samples of said analog input signal.

13. A MASH ADC having quantization noise canceling abilities, comprising:
    means for sampling an analog signal provided to a first delta-sigma modulator to produce a sampled analog input signal;
    means for generating a sampled analog error signal from the difference of said input signal and a DAC output;
    means for integrating said sampled analog error signal to produce a first integrated error signal;
    means for generating, as an output, a first noise signal comprising the quantization noise and test signal using said integrator error signal;
    means for summing a test signal with the first noise shaped signal and quantization noise produced by said first delta-sigma modulator;
    means for estimating an even sample NTF corresponding to even samples of the sampled analog input signal;
    means for estimating an odd sample NTF corresponding to odd samples of the sampled analog input signal;
    means for forming a composite estimated NTF that includes said even and odd estimated NTFs; and
    means for subtracting said composite estimated NTF filtered noise from an analog NTF filtered noise from said first delta-sigma modulator.

14. The MASH ADC of claim 13 wherein said means for generating, as an output, a first noise signal further includes using said DAC output.

15. The MASH ADC of claim 13 wherein said means for estimating the even sample NTF includes means for deriving even sample adaptive coefficients by correlating even samples of a digital output signal of the ADC with associated even samples of said test signal.

16. The MASH ADC of claim 15 wherein said means for estimating the odd sample NTF includes means for deriving odd sample adaptive coefficients by correlating odd samples of the digital output signal with associated odd samples of said test signal.

17. The MASH ADC of claim 16, further comprising means for introducing said first noise signal from said first delta-sigma modulator to a second modulator to produce a second noise signal.

18. The MASH ADC of claim 17 wherein said means for estimating the even sample NTF further includes means for adaptively filtering said second noise signal using said even sample adaptive coefficients, and said means for estimating the odd sample NTF further includes means for adaptively filtering said second noise signal using said odd sample coefficients.

19. A MASH delta-sigma ADC having interleaved digital correction, comprising:

summing a test signal with quantization noise produced by a first stage of the MASH delta-sigma ADC;

alternately coupling a noise signal from a second stage of the MASH delta-sigma ADC between a first adaptive filter and a second adaptive filter;

deriving adaptive coefficients for said first adaptive filter by correlating every other sample of the test signal with a corresponding every other sample of an output signal of the MASH delta-sigma ADC;

deriving adaptive coefficients for said second adaptive filter by correlating samples positioned between said every other sample of the test signal with corresponding samples positioned between said every other sample of the output signal of the MASH delta-sigma ADC;

filtering said noise signal using said first adaptive filter, when said noise signal is coupled to said first adaptive filter, to produce a first digital NTF filtered noise component;

filtering said noise signal using said second adaptive filter, when said noise signal is coupled to said second adaptive filter, to produce a second digital NTF filtered noise component;

summing said first and second digital NTF filtered noise components to form a composite digital NTF noise component; and subtracting said composite digital NTF filtered noise component from an analog NTF filtered noise produced by said first stage of said MASH delta-sigma ADC.

* * * * *